United States Patent
Jain et al.

(10) Patent No.: US 10,748,363 B2
(45) Date of Patent: Aug. 18, 2020

(54) KEY FOB FOR A KEY MANAGEMENT SYSTEM

(71) Applicant: Marcon International Inc, Harrisburg, NC (US)

(72) Inventors: Bobby Jain, Harrisburg, NC (US); Ric Stone, Harrisburg, NC (US); Larry Green, Harrisburg, NC (US)

(73) Assignee: Marcon International Inc, Harrisburg, NC (US)

( * ) Notice: Subject to any disclaimer, the term of this patent is extended or adjusted under 35 U.S.C. 154(b) by 0 days.

(21) Appl. No.: 15/926,145

(22) Filed: Mar. 20, 2018

(65) Prior Publication Data

US 2018/0276929 A1    Sep. 27, 2018

Related U.S. Application Data

(60) Provisional application No. 62/474,122, filed on Mar. 21, 2017.

(51) Int. Cl.
*H05K 1/02* (2006.01)
*G07C 9/00* (2020.01)
*A44B 15/00* (2006.01)
*G09F 3/00* (2006.01)

(52) U.S. Cl.
CPC ........ *G07C 9/00944* (2013.01); *A44B 15/005* (2013.01); *G07C 9/00309* (2013.01); *G09F 3/00* (2013.01); *H05K 1/0275* (2013.01); *G07C 2009/00984* (2013.01)

(58) Field of Classification Search
CPC ... G07C 9/00944; G07C 9/00309; G09F 3/00; H05K 1/0275; H05K 5/0221; H05K 5/0208
See application file for complete search history.

(56) References Cited

U.S. PATENT DOCUMENTS

| | | | |
|---|---|---|---|
| 3,444,547 A | 5/1969 | Surek | |
| 4,725,827 A * | 2/1988 | Gallegos, Jr. ...... | G07C 9/00944 341/20 |
| 5,572,186 A | 11/1996 | Traxler et al. | |
| 5,574,470 A * | 11/1996 | de Vall ............... | G06K 7/10336 340/572.7 |
| 6,195,005 B1 * | 2/2001 | Maloney ................ | A47G 29/10 340/568.1 |
| 6,262,664 B1 * | 7/2001 | Maloney ............ | G08B 21/0288 340/572.8 |
| 6,396,401 B1 | 5/2002 | Matsuo | |
| 6,594,154 B1 * | 7/2003 | Brewer ................ | A44B 15/005 235/492 |
| 6,731,211 B1 * | 5/2004 | King .................... | G06K 19/041 340/568.1 |

(Continued)

*Primary Examiner* — Abhishek M Rathod
*Assistant Examiner* — Keith DePew
(74) *Attorney, Agent, or Firm* — Clements Bernard Walker; Christopher L. Bernard

(57) ABSTRACT

A key fob for retaining a key or other object, including: a body structure manufactured from a printed circuit board material; a key ring structure manufactured from the printed circuit board material coupled to the body structure; and a conductive loop disposed one or more of within, on a surface of, and coupled to the printed circuit board material of the key ring structure. Optionally, the body structure and the key ring structure are integrally formed from the printed circuit board material.

11 Claims, 1 Drawing Sheet

(56) References Cited

U.S. PATENT DOCUMENTS

| | | | | |
|---|---|---|---|---|
| 6,867,695 | B2* | 3/2005 | Prado | G06K 17/00 340/568.1 |
| 6,900,741 | B1 | 5/2005 | Wärnelöv | |
| 7,135,972 | B2 | 11/2006 | Bonato | |
| 7,209,038 | B1 | 4/2007 | Deconinck et al. | |
| 7,336,174 | B1* | 2/2008 | Maloney | G08B 13/1427 340/568.1 |
| 7,626,500 | B2 | 12/2009 | Belden et al. | |
| 7,667,601 | B2 | 2/2010 | Rabinowitz et al. | |
| 7,724,135 | B2 | 5/2010 | Rapp et al. | |
| 7,930,918 | B2* | 4/2011 | Bashan | A44B 15/005 70/408 |
| 7,999,656 | B2* | 8/2011 | Fisher | G07C 9/27 340/5.73 |
| 8,427,314 | B2 | 4/2013 | Billiard | |
| 8,610,574 | B2* | 12/2013 | Kestenbaum | G06K 17/00 340/572.1 |
| 8,698,617 | B2 | 4/2014 | Henson et al. | |
| 8,847,759 | B2 | 9/2014 | Bisesti et al. | |
| 9,041,536 | B2 | 5/2015 | Guessford | |
| 9,165,442 | B2 | 10/2015 | Guessford | |
| 9,847,003 | B2* | 12/2017 | Sayegh | G08B 13/2451 |
| 2001/0022552 | A1* | 9/2001 | Maloney | G08B 21/0288 340/568.1 |
| 2003/0052782 | A1 | 3/2003 | Maloney | |
| 2003/0184437 | A1* | 10/2003 | Maloney | G06K 7/10079 340/539.13 |
| 2003/0206409 | A1* | 11/2003 | Parsons | A44B 15/005 362/183 |
| 2006/0144683 | A1* | 7/2006 | White | B29C 45/14639 200/341 |
| 2006/0164243 | A1 | 7/2006 | Ott | |
| 2007/0090921 | A1* | 4/2007 | Fisher | G07C 9/00896 340/5.73 |
| 2009/0058643 | A1 | 3/2009 | Groth | |
| 2010/0045473 | A1 | 2/2010 | Frizzell | |
| 2010/0052907 | A1 | 3/2010 | Shannon | |
| 2016/0155583 | A1 | 6/2016 | Senzaki | H01H 13/7065 200/5 A |
| 2016/0329658 | A1* | 11/2016 | Wilcox | H01R 13/6205 |

\* cited by examiner

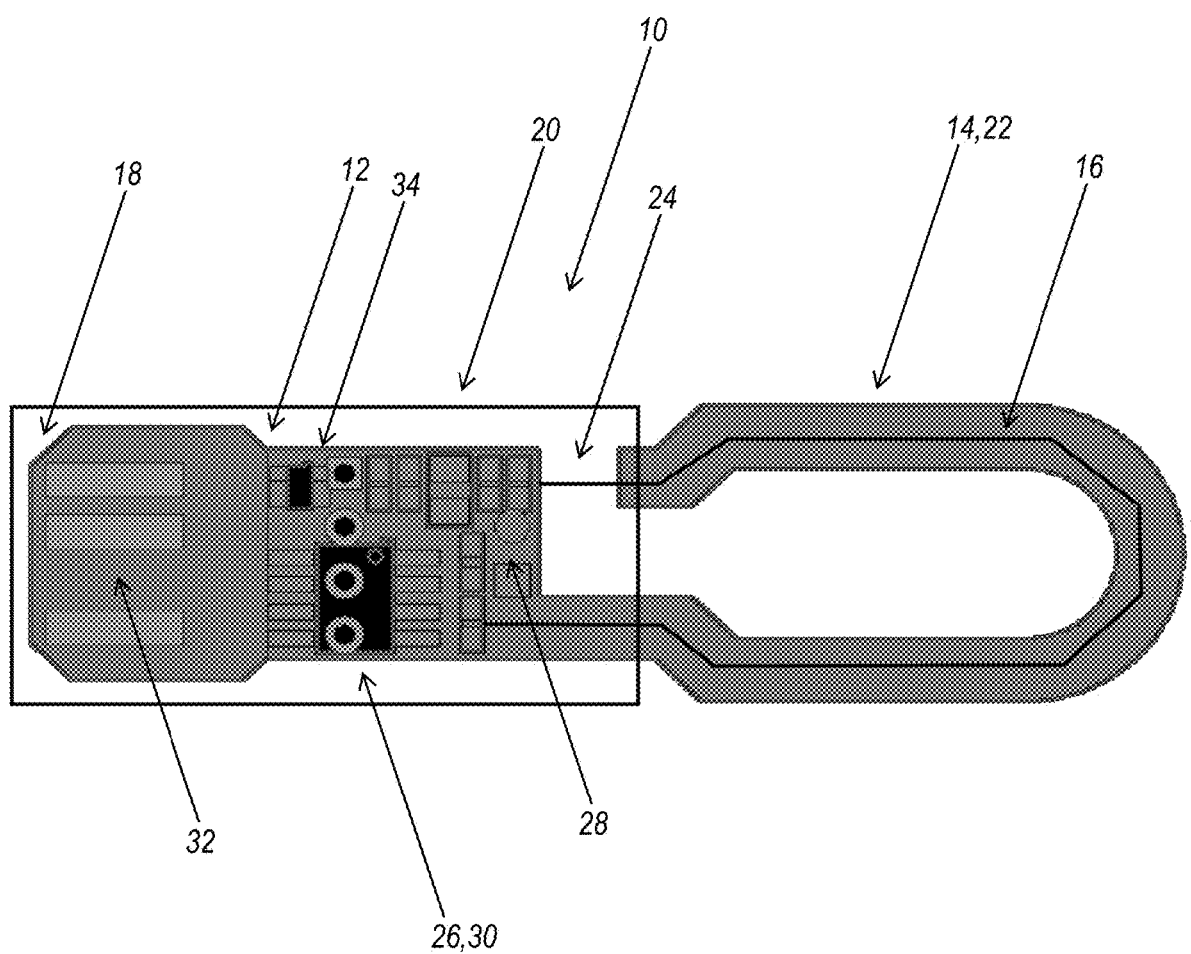

KEY FOB FOR A KEY MANAGEMENT SYSTEM

CROSS-REFERENCE TO RELATED APPLICATION

The present patent application/patent claims the benefit of priority of U.S. Provisional Patent Application No. 62/474,122, filed on Mar. 21, 2017, and entitled "IMPROVED KEY FOB FOR A KEY MANAGEMENT SYSTEM," the contents of which are incorporated in full by reference herein.

FIELD OF THE INVENTION

The present invention relates generally to the key management field. More specifically, the present invention relates to an improved key fob for a key management system. The key fob has an improved shape and is manufactured from a printed circuit board (PCB). The key ring of the key fob is capable of detecting tampering/intrusion. The key fob also utilizes an improved methodology for electronic identification. The key fob further is capable of communicating with the key management system in both directions utilizing only three contact points, without the need for an on-board power source. The key fob may be used in other suitable applications equally.

BACKGROUND OF THE INVENTION

In the key management field, keys for vehicles, rental properties, and the like are typically tethered to key fobs which are then, with proper authorization, releasably retained in a key management system. There are several important concerns related to such key management systems. First, the key fobs must be user friendly and cost effective to manufacture. Second, the key rings of the key fobs must not be easily tampered with such that a key can be removed from the associated key fob, at least not without altering the key management system. Third, the key management system must be able to communicate with the key fobs, such that the presence or absence of a given key fob may be detected, each key fob may be identified, and key fobs (and their associated users) can be tracked. Preferably, this communication would be bidirectional, although it is typically unidirectional. Fourth, each key fob should be able to operate without an on-board power source, if possible.

In various exemplary embodiments, the key fob of the present invention addresses each of these concerns.

BRIEF SUMMARY OF THE INVENTION

In various exemplary embodiments, the present invention provides a key fob for a key management system. The key fob has an improved shape and is manufactured from a PCB. The key ring of the key fob is capable of detecting tampering/intrusion. The key fob also utilizes an improved methodology for electronic identification. The key fob further is capable of communicating with the key management system in both directions utilizing only three contact points, without the need for an on-board power source. The key fob may be used in other suitable applications equally.

In one exemplary embodiment, the present invention provides a key fob for retaining a key or other object, including: a body structure manufactured from a printed circuit board material; a key ring structure manufactured from the printed circuit board material coupled to the body structure; and a conductive loop disposed one or more of within, on a surface of, and coupled to the printed circuit board material of the key ring structure. Optionally, the body structure and the key ring structure are integrally formed from the printed circuit board material. Preferably, an end portion of the body structure is sized and shaped to engage a corresponding receptacle coupled to a key management system. The key fob further includes a housing disposed at least partially about the body structure. The key ring structure includes a loop structure defining an opening configured to receive the key or other object about the loop structure. The opening defined by the loop structure of the key ring structure is selectively closed to retain the key or other object received about the loop structure when the loop structure engages a moveable portion of the housing. The key fob further includes a microcontroller coupled to the body structure and the conductive loop, wherein the microcontroller is operable for detecting a break in the conductive loop. The key fob further includes a visual indicator coupled to the microcontroller, wherein the visual indicator is operable for indicating the break in the conductive loop. The key fob further includes a memory coupled to the body structure, wherein the memory contains a unique permanently coded digital serial number associated with the key fob. The visual indicator is also operable for selectively identifying the key fob. The key fob further includes at least three electrical contacts coupled to the body structure, wherein the at least three electrical contacts are operable for electrically connecting the key fob to a key management system and enabling bidirectional communication between the key fob and the key management system. Alternatively (or in addition), the key fob further includes a wireless transceiver coupled to the body structure, wherein the wireless transceiver is operable for electrically connecting the key fob to the key management system and enabling bidirectional communication between the key fob and the key management system.

In another exemplary embodiment, the present invention provides a method for providing a key fob for retaining a key or other object, including: providing a body structure manufactured from a printed circuit board material; providing a key ring structure manufactured from the printed circuit board material coupled to the body structure; and providing a conductive loop disposed one or more of within, on a surface of, and coupled to the printed circuit board material of the key ring structure. Optionally, the body structure and the key ring structure are integrally formed from the printed circuit board material. Preferably, an end portion of the body structure is sized and shaped to engage a corresponding receptacle coupled to a key management system. The method further includes providing a housing disposed at least partially about the body structure. The key ring structure includes a loop structure defining an opening configured to receive the key or other object about the loop structure. The opening defined by the loop structure of the key ring structure is selectively closed to retain the key or other object received about the loop structure when the loop structure engages a moveable portion of the housing. The method further includes providing a microcontroller coupled to the body structure and the conductive loop, wherein the microcontroller is operable for detecting a break in the conductive loop. The method further includes providing a visual indicator coupled to the microcontroller, wherein the visual indicator is operable for indicating the break in the conductive loop. The method further includes providing a memory coupled to the body structure, wherein the memory contains a unique permanently coded digital serial number associated with the key fob. The visual indicator is also operable for selectively identifying the key fob. The method further includes providing at least three electrical contacts coupled to the body structure, wherein the at least three electrical contacts are operable for electrically connecting the key fob to a key management system and enabling bidirectional communication between the key fob and the key management system. Alternatively (or in addition), the method further includes providing a wireless transceiver coupled to the body structure, wherein the wireless transceiver is operable for electrically connecting the key fob to the key management system and enabling bidirectional communication between the key fob and the key management system.

In a further exemplary embodiment, the present invention provides a key management system, including: a receptacle; and a key fob for retaining a key or other object, including: a body structure manufactured from a printed circuit board material; a key ring structure manufactured from the printed circuit board material coupled to the body structure; and a conductive loop disposed one or more of within, on a surface of, and coupled to the printed circuit board material of the key ring structure; wherein the body structure is configured to selectively engage the receptacle and enable bidirectional communication between the key fob and the key management system.

BRIEF DESCRIPTION OF THE DRAWING

The present invention is illustrated and described herein with reference to the drawing, in which:

FIG. 1 is a schematic diagram illustrating one exemplary embodiment of the key fob of the present invention.

DETAILED DESCRIPTION OF THE INVENTION

Referring now specifically to FIG. 1, in one exemplary embodiment, the present invention provides a key fob 10 for retaining a key or other object (not illustrated). The key fob 10 includes a body structure 12 manufactured from a PCB material. The key fob 10 also includes a key ring structure 14 manufactured from the same PCB material coupled to the body structure 12. The key fob 10 further includes a conductive loop 16 disposed one or more of within, on a surface of, and coupled to the PCB material of the key ring structure 14. Preferably, the body structure 12 and the key ring structure 14 are integrally formed from the PCB material. Preferably, an end portion 18 of the body structure 12 is sized and shaped to engage a corresponding receptacle (not illustrated) coupled to a key management system (not illustrated). Such key management systems are well known to those of ordinary skill in the art, in general, although not incorporating the key fob functionalities detailed herein.

The key fob 10 further includes a housing 20 disposed at least partially about the body structure 12 and, selectively, a portion of the key ring structure 14. This housing 20 is a prismatic structure and may have a substantially rectangular shape, a substantially cylindrical shape, etc., provided that it is sized and shape to partially or wholly surround desired portions of the body structure 12 and the key ring structure 14. The housing 20 may be made of a watertight plastic material, for example. The key ring structure 14 includes a loop structure 22 defining an opening 24 configured to receive the key or other object about the loop structure 22. The opening 24 defined by the loop structure 22 of the key ring structure 14 is selectively closed to retain the key or other object received about the loop structure 22 when the loop structure 22 engages a portion of the housing 20. For example, the entire housing 20 (or a portion thereof) may translate with respect to the loop structure, thereby securely opening/closing the opening 24 and locking the key fob 10 to the key or other object. It will be readily apparent to those of ordinary skill in the art that any suitable securement mechanism can be utilized equally.

The key fob 10 further includes a microcontroller 26 coupled to the body structure 12 and the conductive loop 16. The microcontroller 26 is operable for detecting a break in the conductive loop 16, which typically includes a metal wire or conductive lead manufactured into or on a surface of the loop structure 22. The key fob 10 further includes a visual indicator 28, such as a light-emitting diode (LED) or the like, coupled to the microcontroller 26. The visual indicator 28 is operable for indicating the break in the conductive loop 16. Such a break in the electrical circuit may indicate that the conductive loop 16 has been tampered with in an attempt to remove the key or other object.

The key fob 10 further includes a memory 30 coupled to the body structure 12. The memory 30 contains a unique permanently coded digital serial number or the like associated with the key fob 10, thereby allowing each key fob 10 be uniquely addressed and identified. Accordingly, the visual indicator 28 is also operable for selectively identifying the particular key fob 10. This on-board identification signaling is unique and allows a given key fob 10 to be quickly located when multiple such key fobs 10 are coupled to the key management system, for example.

The key fob 10 further includes at least three electrical contacts 32 coupled to the body structure 12. The at least three electrical contacts 32 are operable for electrically connecting the key fob 10 to a key management system and enabling bidirectional communication between the key fob 10 and the key management system. This bidirectional communication can be used by the key fob 10 to identify itself to the key management system, by the key management system to select and signal the key fob 10, by the key fob 10 to signal an attempted intrusion to the key management system, etc.

Alternatively (or in addition), the key fob 10 includes a wireless transceiver 34 coupled to the body structure 12. Again, the wireless transceiver 34 is operable for electrically connecting the key fob 10 to the key management system and enabling bidirectional communication between the key fob 10 and the key management system. Again, this bidirectional communication can be used by the key fob 10 to identify itself to the key management system, by the key management system to select and signal the key fob 10, by the key fob 10 to signal an attempted intrusion to the key management system, etc.

Because the key fob 10 is composed largely of a thin PCB, all components can be directly coupled to the PCB and all electrical contacts can be disposed on the surface of the PCB. This reduces manufacturing complexity and, correspondingly, manufacturing cost. Importantly, a slim form factor is enabled. The key fob 10 may include an on-board power source, or all power can be drawn from the key management system itself Advantageously, the bidirectional communication of the present invention allows the key management system to perform advanced functions through the key fob 10. For example, a host can send instructions to the key fob 10 to flash the LED in a specific pattern for a given user or the like. This is done over a single conductor 32, instead of two for two directions, as would conventionally be required. The remaining two of three conductors 32 are required for DC power.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following non-limiting claims for all purposes.

What is claimed is:

1. A key fob for retaining a key or other object, comprising:
    a body structure manufactured from a printed circuit board material;
    a key ring structure manufactured from the same printed circuit board material integrally formed with the body structure, wherein the printed circuit board material of the key ring structure forms a hook structure defining an opening configured to receive the key or other object on the key ring structure;
    a housing disposed at least partially about the body structure and adapted to selectively translate with respect to the body structure and the key ring structure and encompass the opening of the printed circuit board hook structure of the key ring structure to secure the key or other object on the key ring structure;
    a conductive loop disposed one or more of within and on a surface of the printed circuit board material of the key ring structure and the body structure; and
    a microcontroller and a visual indicator disposed on the printed circuit board material, wherein the microcontroller and the visual indicator are operable for selectively detecting and indicating a break in the conductive loop and visually identifying the key fob.

2. The key fob of claim 1, wherein an end portion of the body structure is sized and shaped to engage a corresponding receptacle coupled to a key management system.

3. The key fob of claim 1, further comprising a memory disposed on the printed circuit board material, wherein the memory contains a unique permanently coded digital serial number associated with the key fob.

4. The key fob of claim 1, further comprising at least three electrical contacts coupled to the body structure, wherein the at least three electrical contacts are operable for electrically connecting the key fob to a key management system and enabling bidirectional communication between the key fob and the key management system.

5. The key fob of claim 1, further comprising a wireless transceiver coupled to the body structure, wherein the wireless transceiver is operable for electrically connecting the key fob to a key management system and enabling bidirectional communication between the key fob and the key management system.

6. A method for providing a key fob for retaining a key or other object, comprising:
    providing a body structure manufactured from a printed circuit board material;
    providing a key ring structure manufactured from the same printed circuit board material integrally formed with the body structure, wherein the printed circuit board material of the key ring structure forms a hook structure defining an opening configured to receive the key or other object on the key ring structure;
    providing a housing disposed at least partially about the body structure and adapted to selectively translate with respect to the body structure and the key ring structure and encompass the opening of the printed circuit board loop hook structure of the key ring structure to secure the key or other object on the key ring structure;
    providing a conductive loop disposed one or more of within and on a surface of the printed circuit board material of the key ring structure and the body structure; and
    providing a microcontroller and a visual indicator disposed on the printed circuit board material, wherein the microcontroller and the visual indicator are operable for selectively detecting and indicating a break in the conductive loop and visually identifying the key fob.

7. The method of claim 6, wherein an end portion of the body structure is sized and shaped to engage a corresponding receptacle coupled to a key management system.

8. The method of claim 6, further comprising providing a memory disposed on the printed circuit board material, wherein the memory contains a unique permanently coded digital serial number associated with the key fob.

9. The method of claim 6, further comprising providing at least three electrical contacts coupled to the body structure, wherein the at least three electrical contacts are operable for electrically connecting the key fob to a key management system and enabling bidirectional communication between the key fob and the key management system.

10. The method of claim 6, further comprising providing a wireless transceiver coupled to the body structure, wherein the wireless transceiver is operable for electrically connecting the key fob to a key management system and enabling bidirectional communication between the key fob and the key management system.

11. A key management system, comprising:
    a receptacle; and
    a key fob for retaining a key or other object, comprising:
        a body structure manufactured from a printed circuit board material;
        a key ring structure manufactured from the same printed circuit board material integrally formed with the body structure, wherein the printed circuit board material of the key ring structure forms a hook structure defining an opening configured to receive the key or other object on the key ring structure;
        a housing disposed at least partially about the body structure and adapted to selectively translate with respect to the body structure and the key ring structure and encompass the opening of the printed circuit board loop hook structure of the key ring structure to secure the key or other object on the key ring structure;
        a conductive loop disposed one or more of within and on a surface of the printed circuit board material of the key ring structure and the body structure; and
        a microcontroller and a visual indicator disposed on the printed circuit board material, wherein the microcontroller and the visual indicator are operable for selectively detecting and indicating a break in the conductive loop and visually identifying the key fob;
    wherein the body structure is configured to selectively engage the receptacle and enable bidirectional communication between the key fob and the key management system.

* * * * *